United States Patent [19]
Kiriyama et al.

[11] Patent Number: 5,999,113
[45] Date of Patent: Dec. 7, 1999

[54] INTERPOLATION CIRCUIT FOR ENCODER HAVING A LOOK-UP TABLE MEMORY WITH REDUCED CAPACITY

[75] Inventors: Tetsuro Kiriyama; Mikiya Teraguchi, both of Kawasaki, Japan

[73] Assignee: Mitutoyo Corporation, Kawasaki, Japan

[21] Appl. No.: 09/059,338

[22] Filed: Apr. 14, 1998

[30] Foreign Application Priority Data

Apr. 28, 1997 [JP] Japan .................................. 9-111123

[51] Int. Cl.⁶ ...................................................... H03M 1/48
[52] U.S. Cl. ............................................ 341/111; 341/112
[58] Field of Search ................................. 341/111, 112, 341/113, 116, 117; 318/602, 661

[56] References Cited

U.S. PATENT DOCUMENTS

| | | | |
|---|---|---|---|
| 5,121,116 | 6/1992 | Taniguchi | 341/116 |
| 5,191,336 | 3/1993 | Stephenson | 341/111 |
| 5,216,626 | 6/1993 | Kranitzky | 364/561 |
| 5,585,753 | 12/1996 | Ishiwata et al. | 327/133 |
| 5,721,546 | 2/1998 | Tsutsumishita | 341/116 |

FOREIGN PATENT DOCUMENTS

| | | |
|---|---|---|
| 0 408 199 A1 | 1/1991 | European Pat. Off. . |
| 3-68812 | 3/1991 | Japan . |
| 646 784 A5 | 12/1984 | Switzerland . |

OTHER PUBLICATIONS

Hagiwara, Nobumi et al., "A Method of Improving the Resolution and Accuracy of Rotary Encoders Using a Code Compensation Technique," IEEE Transactions on Instrumentation and Measurement, vol. 41, No. 1, Feb. 1992, pp. 98–101.

*Primary Examiner*—Howard L. Williams
*Assistant Examiner*—Pequy JeanPierre
*Attorney, Agent, or Firm*—Oliff & Berridge, PLC

[57] ABSTRACT

Output of an encoder are sampled by A/D converters 11a and 11b to be converted to N bits A-phase and B-phase digital data DA and DB. In a look-up table memory 12, reference phase angle data of phase divisions and average gradient vectors of changes in phase angle data within the phase divisions are stored, the phase divisions being addressed by the high order NU bits of data DA and DB. An arithmetic circuit 13 determines a vector inner product of an average gradient vector and phase-interpolating data represented by the low order NL bits of the data DA and DB to add the resultant to a phase angle data, thereby outputting an interpolated phase angle data.

5 Claims, 3 Drawing Sheets

INTERPOLATION CIRCUIT FOR ENCODER HAVING A LOOK-UP TABLE MEMORY WITH REDUCED CAPACITY

BACKGROUND OF THE INVENTION

1. Field of the Invention

This invention relates to an interpolation circuit performing digital interpolation processing to two-phase sinusoidal signals of an encoder, which detects position, angle, velocity, angular velocity and so on, to obtain phase angle data with high resolution.

2. Related Art

Since there is a machining limit in grid spaces formed in a scale of the encoder, a space period of the sinusoidal signals from the encoder should be subdivided to be interpolated in order to measure a space finer than the scale grid. Therefore, various interpolation circuits have been used previously.

FIG. 4 is an example of the interpolation circuit by previous digital processing. Two-phase sinusoidal signals INA and INB of a phase A and a phase B shifted by 90° each other are output from an encoder 1, and then sampled with a predetermined frequency by A/D converters 2a and 2b to be converted to digital data DA and DB respectively. Phase angle data at each sampling point are prepared and stored in a look-up table memory 3 in advance using an arc tangent function (ATAN) based on the following formula.

$$u = \text{ATAN}(DB/DA) \tag{1}$$

Therefore, the phase angle data u at each sampling point is obtained by reading the look-up table memory 3, defining the digital data DA and DB as addresses x and y respectively. Furthermore, the phase angle data u is entered in a two-phase square wave data generation circuit 4, whereby digital two-phase square wave data OUTA and OUTB are obtained.

When intending to obtain a sufficient interpolation number in the interpolation circuit in which the look-up table memory is used as described above, capacity of the look-up table memory becomes extremely large. For example, when the digital data DA and DB obtained by A/D converters 2a and 2b are N bits, the size of the address space specified by the digital data DA and DB is N×N. When a required interpolation number is defined as I, the integer J beyond $\log_2 I$ is required to the phase angle data. In such a condition, the memory capacity required in the look-up table memory becomes $2^{2N} \times J$.

For example, the memory configuration where the phase angle data obtained by dividing one period into 400 are addressed with the address of 8 bits×8 bits becomes as FIG. 5. When a data length is defined as J=9, the memory capacity becomes $2^8 \times 2^8 \times 9 = 589,824$ bits.

As a method for reducing the capacity of the look-up table memory in the encoder interpolation circuit of a digital system as described above, a method for reducing the address space have been proposed, paying attention to the symmetry that the phase angle data is repeated periodically within an address space with exception of a sign (Japanese Laid-open Patent Publication No.Hei.3-68812).

SUMMARY OF THE INVENTION

The object of this invention is to provide an interpolation circuit of an encoder wherein the phase angle data defined by the high order bits of the digital data obtained by A/D conversion is designed to be interpolated utilizing the low order bits thereof, whereby the capacity of the look-up table memory is able to be reduced.

The interpolation circuit of the encoder according to the present invention comprises: an A/D conversion circuit for sampling A-phase and B-phase sinusiodal signals, which are output from an encoder as phase-shifted by 90° each other, with a given frequency to convert the resultant to A-phase and B-phase digital data with N bits, respectively; a look-up table memory which stores reference phase angle data corresponding to a plurality of phase divisions and interpolation factors prepared for every phase divisions for interpolating the reference phase data to obtain an interpolated phase angle data, the phase divisions being obtained by dividing an phase space, two-dimensional address of which is assigned by the A-phase and B-phase digital data, to have two-dimensional addresses specified by the high order NU bits data in the A-phase and B-phase digital data, and in which the high order NU bits data is entered as the two-dimensional address signals; and an arithmetic circuit for obtaining the interpolated phase angle data by processing the reference phase angle data and the respective interpolation factor read out from the look-up table memory and a phase-interpolating data represented by the low order NL (=N−NU) bits data in the A-phase and B-phase digital data.

In the present invention, the phase space usually required to a conventional look-up table memory corresponding to a required interpolation number is divided into a plurality of phase divisions. In the look-up table memory in the present invention, the phase angle data corresponding to the number of the phase divisions respectively defined by the high order NU bits of the A-phase and B-phase digital data are stored, and the reference phase angle data is read to be interpolated by the low order NL bits sata. The interpolation factors used in the interpolation of the phase angle data are stored in the look-up table memory as well as the phase angle data defined by the high order NU bits data. Therefore, the interpolated phase angle data can be obtained by simple interpolation operation in such a manner that the required interpolation number is maintained, while the capacity of the look-up table memory is reduced by a large amount as compared to the case that the look-up table memory has an full address of N×N and the entire phase angle data defined by this address are stored.

Concretely, since the two-dimensional address is used for processing the A-phase and B-phase sinusiodal signals, and the phase-interpolating data and the interpolation factor are expressed as two-dimension data, vector operation is used for interpolation operation. For example, in the present invention, an average gradient vector of a change in phase angle data within each small address space as the interpolation factors as well as the reference phase angle data of the reference position of each phase divisions being addressed by the high order NU bits of the A-phase and B-phase digital data are stored in the look-up table memory. In this case, such an interpolation operation is performed that a vector inner product of the phase-interpolating data composed of the low order NL bits of the A-phase and B-phase digital data and the average gradient vector read from the look-up table memory is produced, and then the resultant is added to the reference phase angle data read from the look-up table memory. As a result, a deviation (an error) of the phase angle data interpolated according to the present invention from the phase angle data which is obtained when using the look-up table memory having the full address becomes sufficiently small.

BRIEF DESCRIPTION OF THE DRAWINGS

The embodiments according to the present invention will be described referring to the following drawings.

DETAILED DESCRIPTION OF THE PREFERRED EMBODIMENTS

Figure 1:
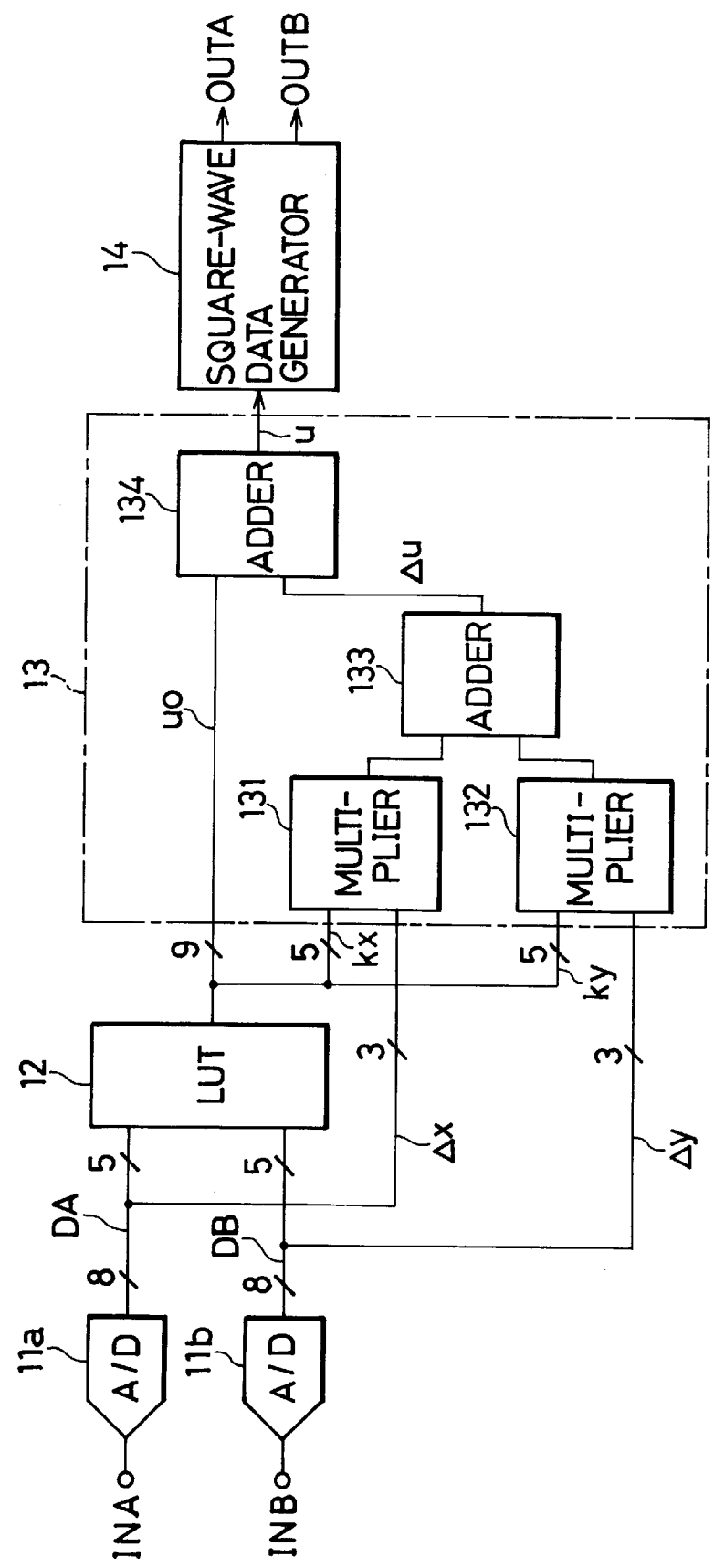
FIG. 1 shows an interpolation circuit of an encoder according to an embodiment of the present invention.

FIG. 1 shows an interpolation circuit of an encoder according to an embodiment of the present invention. Although it is no matter what principle is used for the encoder to which the interpolation circuit is applied, an optical encoder and a magnetic encoder using MR elements are preferably used as the encoder. The A-phase and B-phase sinusoidal signals INA and INB output from the encoder are sampled by A/D converters 11a and 11b with a predetermined frequency, respectively, whereby the A-phase and B-phase digital data DA and DB are obtained. A look-up table memory 12 constituted by nonvolatile memory such as ROMs is used in order to determine phase angle. The look-up table memory 12 is accesses by the digital data DA and DB. This basic configuration is similar to prior art. However, in this embodiment, the phase angle data, number of which is determined by use of predetermined high order bits of the data DA and DB as two-dimensional address signals, are stored in the look-up table memory 12.

Figure 3:
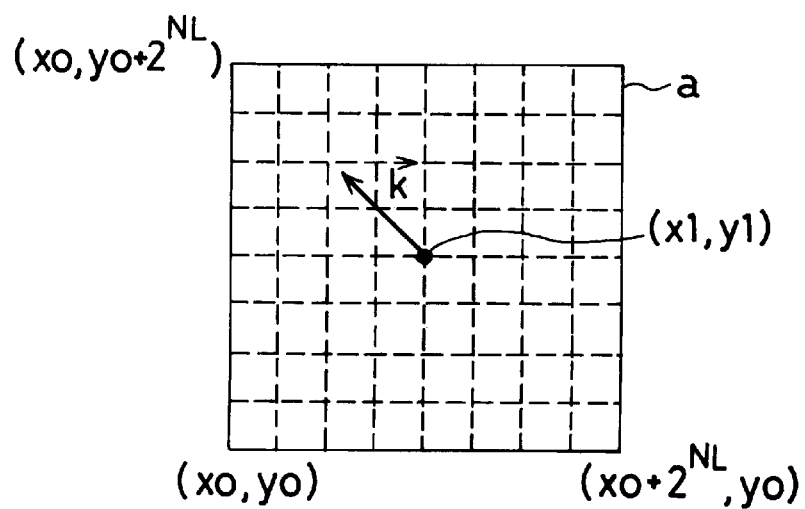
FIG. 3 is a view for illustrating a relationship between a reference phase angle data and an average gradient vector according to the embodiment.
Figure 4:
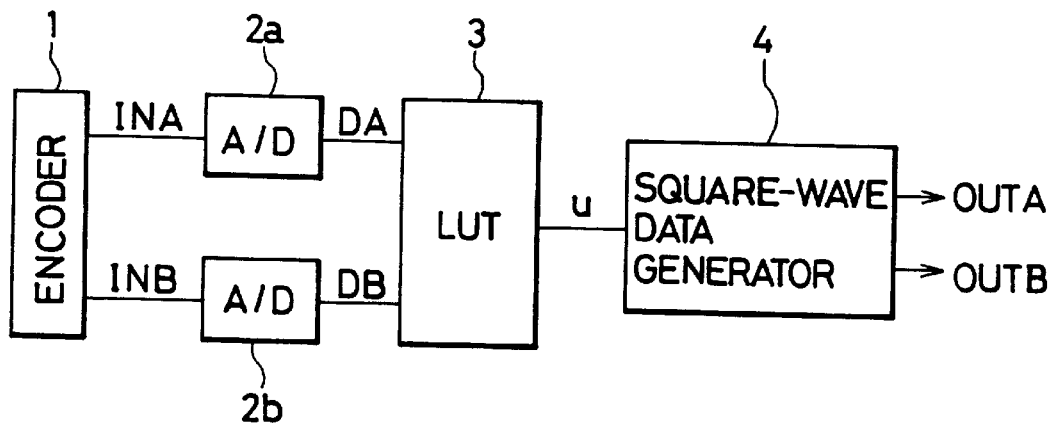
FIG. 4 shows an interpolation circuit of a prior encoder.
Figure 5:
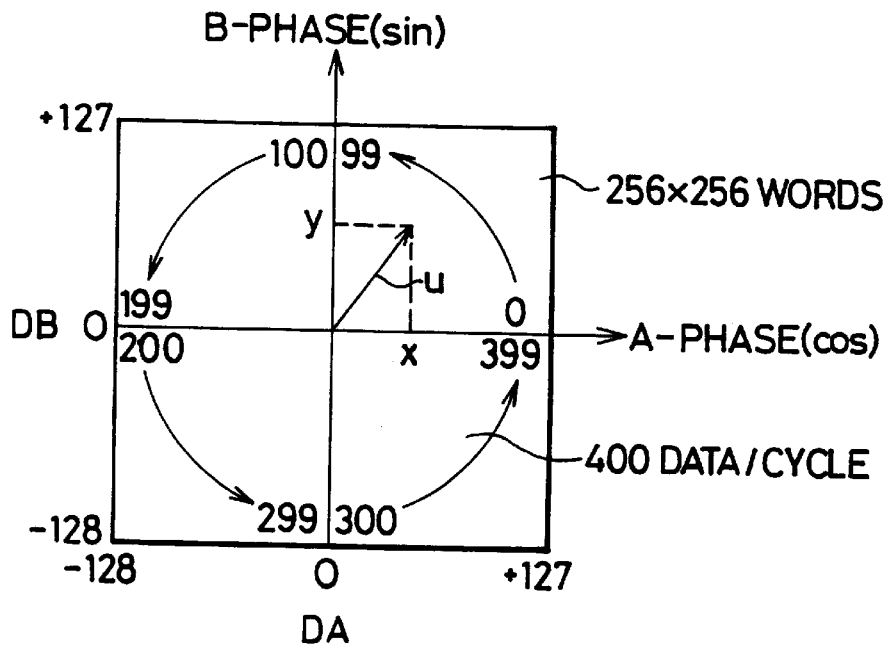
FIG. 5 shows an address and a phase space of a look-up table memory in the interpolation circuit in FIG. 4.

Namely, in the case of the embodiment, the data DA and DB are N bits (N=8 in FIG. 1), respectively. The high order NU bits (NU=5 in FIG. 1) of these data DA and DB are entered into the look-up table memory 12 as two-dimensional address signals. In the memory 12, the reference phase angle data u0 corresponding to the respective reference positions (x0, y0) of the respective phase divisions "a" are stored with interpolation factors which are prepared corresponding to the respective reference phase angle data for phase angle interpolating. The phase divisions "a" are obtained by dividing an phase space, each two-dimensional address of which is assigned by the A-phase and B-phase digital data to have two-dimensional addresses specified by the high order NU bits data in the A-phase and B-phase digital data. The size of each phase division "a" is NL×NL required to store the phase angle data of $2^{2NL}$ words (64 words in the case of NL=3) in the case of using the digital data DA and DB of N bits as the full address, as shown in FIG. 3.

As is described below, average gradient vector data of the changes in the phase angle data within the respective phase divisions "a" are used as the interpolation factors being stored as well as the reference phase angle data u0. It is appreciated that each of the reference positions of the reference phase angle data u0 is a predetermined position in the respective phase division "a".

Data Δx and Δy of the low order NL bits (NL=3 in FIG. 1) of the respective data DA and DB are entered into an arithmetic circuit 13 for performing interpolation operation as phase-interpolating data, respectively. In the arithmetic circuit 13, operation for interpolating the phase angle data is performed based on the reference phase angle data and the interpolation factors (i.e., the average gradient vectors) read out from the look-up table memory 12 and the phase-interpolating data corresponding to the low order bits data Δx and Δy.

Figure 2:
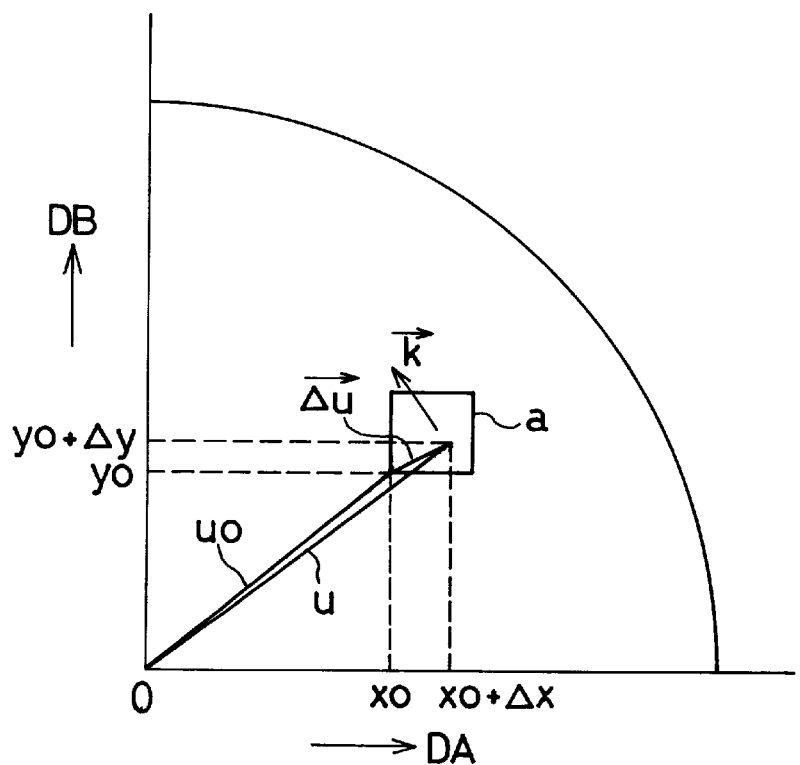
FIG. 2 is a view for illustrating principles of interpolation of phase angle data according to the embodiment.

Referring to FIG. 2, the principle of interpolation of phase angle data according to this embodiment will be described. FIG. 2 shows only the upper right quadrant of the phase space wherein the data DA and DB are represented as addresses x and y. In FIG. 2, u0 is a certain reference phase angle data read out from the look-up table memory 12, and Δu is a vector of the phase-interpolating data defined by the data of NL bits×NL bits that is to be included in the phase division "a". A phase angle data u to be obtained in the case of using the full address of N bits×N bits is obtained by interpolating the reference phase angle data u0 using the vector Δu of the phase-interpolating data. The amount of changes (the gradient) in the phase angle data within each phase division "a" is determined by the reference position (x0, y0) of the phase divisions "a", and is substantially uniform. Therefore, as described above, the average gradient vector K of the phase angle data in the phase divisions "a" is determined in advance to be stored as the interpolation factor in the look-up table memory 12 as well as the reference phase angle data u0. An interpolated phase angle data u can be obtained by performing a vector inner product operation of the vector Δu of the phase-interpolating data and the average gradient vector K, and by adding the result to the reference phase angle data u0, as represented by the following formula (2).

$$u = u0 + K \times \Delta u \quad (2)$$

x-, y-components of the phase-interpolating data vector Δu are Δx, Δy, respectively. When x-, y-components of the average gradient vector K are defined as kx, ky, respectively, the formula (2) becomes the following formula (3).

$$u = u0 + (kx \cdot \Delta x + ky \cdot \Delta y) \quad (3)$$

The interpolation operation using the vector inner product described above is performed in the arithmetic circuit 13 in FIG. 1. A first and a second multipliers 131 and 132 multiply the components kx and ky of the average gradient vector K, which are read out from the memory 12, and components Δx and Δy (i.e., components of the phase-interpolating data) represented by the low order NL bits of the digital data DA and DB, respectively. A first adder 133 adds the multiplied results of the multipliers 131 and 132. The phase-interpolating data vector Δu can be obtained by the adder 133. A second adder 134 adds the phase-interpolating data vector Δu to the reference phase angle data u0 read out from the memory 12. As a result an interpolated phase angle data u that is to be required can be obtained.

The interpolated phase data u is, for example, processed in a two-phase square wave data generation circuit 14 in a conventional manner, whereby two-phase square wave data OUTA and OUTB are output.

For example, the components kx and ky of the average gradient vector K in the phase division "a" described above are given by a formula (4) described below, defining a center of the phase division "a" as a typical point (x1, y1) as shown in FIG. 3.

$$kx = -A \cdot y1/(x1^2 + y1^2)$$

$$ky = +A \cdot y1/(x1^2 + y1^2) \quad (4)$$

In formula (4), when the number of interpolation is defined as I, "A" is: $A=I/2\pi$. The formula (4) is introduced using a mathematical formula of a scalar field. That is, when data represented by the scalar field having a certain spatial distribution of the changes is defined as $u=A\cdot\phi$, and x-, y-components of a change portion vector $\Delta u$ of the data are defined as $\Delta x$, $\Delta y$, respectively, "u" can be given by the following partial differential equation (5).

$$u=u0(x0, y0)+(\delta u/\delta x)\Delta x+(\delta u/\delta y)\Delta y$$

$$=u0(x0, y0)+(-Ay1)/(x1^2+y1^2)+(+Ax1)/(x1^2+y1^2) \quad (5)$$

Based on the mathematical formula, when the data to be stored in the memory is defined as $A=I/2\pi$ (I is defined as the number of interpolation), the components of the average gradient vector of the formula (4) are obtained.

As is described in FIG. 3, it is preferable that the typical point (x1, y1) determining the average gradient vector K is defined as a center of the phase division "a" in order to improve the accuracy of approximation. However, since the changes within the phase division are small, a large approximation error can not be occurred even when other typical points are selected. For example, the reference position (x0, y0) can be selected as a typical point.

Moreover, as the other simple method determining the average gradient vector of the changes in the phase angle data, for example, the average gradient vector can be obtained by calculating a difference between two typical points of adjacent phase divisions as follows.

$$kx=\{u(x0+2NL, y0)-u(x0, y0)\}/2^{NL}$$

$$ky=\{u(x0, y0+2NL)-u(x0, y0)\}/2^{NL} \quad (6)$$

It will be described that the approximation error of interpolation of the phase angle data using the aforementioned average gradient vector K is small, concretely providing the examples of numeral calculations.

When the number of interpolation I is 400, the phase angle data u at several positions y/x (=DB/DA) in a range in which the signal amplitude becomes approximately one-half of the minimum, is determined as described in the following Table 1

TABLE 1

| Phase angle data u | | | | |
|---|---|---|---|---|
| 19 | 18.37204 | 18.1047 | 17.84443 | 17.59154 |
| 18 | 17.45404 | 17.19849 | 16.95013 | 16.70868 |
| 17 | 16.52854 | 16.28528 | 26.04893 | 15.8192 |
| 16 | 15.59583 | 15.36517 | 15.1411 | 14.92337 |
| y/x | 64 | 65 | 66 | 67 |

In TABLE 1, when the difference data $\Delta u$ is determined, defining (x, y)=(64, 16) as the reference position, resulting in as Table 2.

TABLE 2

| Difference data $\Delta u$ | | | | |
|---|---|---|---|---|
| 19 | 2.776216 | 2.508671 | 2.248604 | 1.995715 |
| 18 | 1.858216 | 1.602661 | 1.354306 | 1.112858 |
| 17 | 0.932709 | 0.689453 | 0.453103 | 0.223374 |
| 16 | 0 | −0.23066 | −0.45472 | −0.67246 |
| y/x | 64 | 65 | 66 | 67 |

Next, when partial differential quotients $\delta u/\delta x$ and $\delta u/\delta y$ of each phase angle (these quotients correspond to the gradient vector components kx and ky) are determined from the phase angle data u of the TABLE 1, resulting in as TABLE 3 and Table 4 described below.

TABLE 3

| $\delta u/\delta x$ | | | | |
|---|---|---|---|---|
| 19 | −0.27139 | −0.26375 | −0.25643 | −0.24940 |
| 18 | −0.25926 | −0.25190 | −0.24485 | −0.23809 |
| 17 | −0.24681 | −0.23975 | −0.23299 | −0.22651 |
| 16 | −0.23405 | −0.22731 | −0.22086 | −0.21467 |
| y/x | 64 | 65 | 66 | 67 |

TABLE 4

| $\delta u/\delta y$ | | | | |
|---|---|---|---|---|
| 19 | 0.91415 | 0.90232 | 0.89075 | 0.87945 |
| 18 | 0.92180 | 0.90966 | 0.89780 | 0.88621 |
| 17 | 0.92916 | 0.91671 | 0.90456 | 0.89271 |
| 16 | 0.93621 | 0.92346 | 0.91103 | 0.89892 |
| y/x | 64 | 65 | 66 | 67 |

The interpolated phase angle data $u=u0+kx\cdot\Delta x+ky\cdot\Delta y$ is determined by using the reference phase angle u0 of y/x= 16/64, using the partial differential quotients $\delta u/\delta x=-0.24238$ and $\delta u/\delta y=0.907181$ in x1=65.5, y1=17.5 as the average gradient vector components kx and ky from TABLE 3 and TABLE 4, resulting in as TABLE 5 described below.

TABLE 5

| $u = u0 + kx \cdot \Delta x + ky \cdot \Delta y$ | | | | |
|---|---|---|---|---|
| 19 | 18.31737 | 18.07499 | 17.83262 | 17.59024 |
| 18 | 17.41019 | 17.16781 | 16.92544 | 16.68306 |
| 17 | 16.50301 | 16.26063 | 16.01825 | 15.77588 |
| 16 | 15.59583 | 15.35345 | 15.11107 | 14.8687 |
| y/x | 64 | 65 | 66 | 67 |

The results of the TABLE 5 correspond to the phase angle data being approximately obtained by the interpolation circuit of the embodiment. The errors between TABLE 1 and TABLE 5 are summarized as described in the following TABLE 6.

TABLE 6

| Error | | | | |
|---|---|---|---|---|
| 19 | −0.05467 | −0.02950 | −0.01181 | −0.00130 |
| 18 | −0.04385 | −0.03067 | −0.02470 | −0.02563 |
| 17 | −0.02553 | −0.02467 | −0.03067 | −0.04332 |
| 16 | −0.00000 | −0.01172 | −0.03003 | −0.05467 |
| y/x | 64 | 65 | 66 | 67 |

From the numeral data described above, the errors of the approximate value obtained by the interpolation circuit of the embodiment are such small as less than ±1 LSB of the number of interpolation 400.

As is described above, when the phase angle data of the number of interpolation 400 was assigned in the look-up table memory being addressed by the address of 8 bits×8 bits, the memory capacity was $2^8 \times 2^8 \times 9 = 589,824$, defining a data length of the phase angle data as 9. In contrast with this, in case of the embodiment, assuming that the reference phase angle with the same data length and the gradient vector components kx and ky of 5 bits respectively are stored in the look-up table designated by the high order bit of 5 bits×5 bits, the memory capacity becomes $2^5 \times 2^5 \times (9+$ 5+5)=19,456 bits. Namely, the memory capacity can be compressed to one thirtieth in comparison with the above-described example.

Such Nonvolatile memories as ROM, EPROM and EEPROM, and PLD, RAM or the like can be used as the look-up table memory 12 shown in FIG. 1. Moreover, the arithmetic circuit 13 performing interpolation operation can be realized through software by a microprocessor or by a DSP except the digital circuit.

According to the present invention, in the look-up table memory for interpolating, the phase angle data designated by the high order NU bits of the digital data obtained by converting output of the encoder by A/D converter and the average gradient vector of the changes in the phase angle data determined in advance in response to the phase position of the reference phase angle data are stored. The interpolation operation is performed based on the data of the low order NL bits, and the reference phase angle data and the average gradient vector read from the look-up table memory, whereby the capacity of the look-up table memory can be largely compressed.

Although the present invention has been shown and described with respect to best mode embodiments thereof, it should be understood by those skilled in the art that the foregoing and various other changes, omissions, and additions in the form and detail thereof may be made therein without departing from the spirit and scope of the present invention.

The entire disclosure of Japanese Patent Application No. 9-111123 filed on Apr. 28, 1997 including specification, claims, drawings and abstract are incorporated herein by reference in its entirety.

What is claimed is:

1. An interpolation circuit for an encoder, comprising:

an A/D conversion circuit for sampling A-phase and B-phase sinusoidal signals, which are output from an encoder as phase-shifted by 90° from each other, with a given frequency to convert the resultant to A-phase and B-phase digital data with N bits, respectively;

a look-up table memory which stores reference phase angle data corresponding to a plurality of phase angle division and interpolation factors prepared for every phase division for interpolating the reference phase angle data to obtain an interpolated phase angle data, the phase angle division being obtained by dividing a phase space, a two-dimensional address of which is assigned by the A-phase and B-phase digital data, to have two-dimensional addresses specified by the high order NU bits data in the A-phase and B-phase digital data, and in which the high order NU bits data are entered as the two-dimensional address signals; and an arithmetic circuit for obtaining the interpolated phase angle data by processing the reference phase angle data and the interpolation factors read out from the look-up table memory and a phase-interpolating data represented by the low order NL (=N−NU) bits data in the A-phase and B-phase digital data, wherein the interpolation factors stored in the look-up table memory are average gradient vectors of changes of the phase angle data predetermined in response to phase positions of the phase division.

2. The interpolation circuit according to claim 1, wherein the arithmetic circuit comprises:

multiplication means for determining a vector inner product of the phase-interpolating data and the average gradient vector read out from the look-up table memory; and addition means for adding the vector inner product determined by the multiplication means to the reference phase angle data read out from the look-up table memory to output the interpolated phase angle data.

3. The interpolation circuit according to claim 1, wherein the arithmetic circuit comprises:

first and second multiplication means for performing multiplication of kx·Δx and ky·Δy, respectively, where Δx, Δy are x-, y-components of the phase-interpolating data, respectively, and kx, ky are x-, y-components of the average gradient vector read out from the look-up table memory, respectively;

first addition means for adding the results obtained by the first and second multiplication means; and second addition means for adding the result added by the first addition means to the reference phase angle data read out from the look-up table memory.

4. The interpolation circuit according to claim 1, wherein x-, y-components of the average gradient vector are obtained as partial differential quotients of the phase angle data at a center point within the respective phase division.

5. The interpolation circuit according to claim 1, wherein x-, y-components of the average gradient vector are obtained as differentiated values between two typical points in the respective phase division and another phase division adjacent thereto.

* * * * *